United States Patent
Pai et al.

(10) Patent No.: US 8,253,509 B2
(45) Date of Patent: Aug. 28, 2012

(54) PRINTED CIRCUIT BOARD

(75) Inventors: Yu-Chang Pai, Taipei Hsien (TW);
Chien-Hung Liu, Taipei Hsien (TW);
Po-Chuan Hsieh, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 199 days.

(21) Appl. No.: 12/823,147

(22) Filed: Jun. 25, 2010

(65) Prior Publication Data

US 2011/0298563 A1 Dec. 8, 2011

(30) Foreign Application Priority Data

Jun. 8, 2010 (CN) .................................. 99 1 18510

(51) Int. Cl.
*H04B 3/28* (2006.01)

(52) U.S. Cl. ................. 333/12; 333/4; 333/246

(58) Field of Classification Search .................... 333/12, 333/204, 246, 4

See application file for complete search history.

(56) References Cited

U.S. PATENT DOCUMENTS 7,183,883 B2 * 2/2007 Kanno et al. .................. 333/204
7,764,147 B2 * 7/2010 Koizumi et al. .............. 333/204
2010/0052820 A1 * 3/2010 Wu et al. ....................... 333/204

OTHER PUBLICATIONS

Liu et al., "An Embedded Common-Mode Suppression Filter for GHz Differential Signals Using Periodic Defected Ground Plane", IEEE Microwave & Wireless Components Letters, vol. 18, No. 4, Apr. 2008, pp. 248-250.*
Wu et al., "A Novel HU-shaped Common-mode Filter for GHz Differential Signals", IEEE International Symposium on Electromagnetic Compatibility, Aug. 18-22, 2008, pp. 1-4.*

* cited by examiner

*Primary Examiner* — Seungsook Ham
(74) *Attorney, Agent, or Firm* — Altis Law Group, Inc.

(57) ABSTRACT

A printed circuit board includes a signal layer and a ground layer adjacent to the signal layer. The signal layer includes a pair of differential transmission lines. The ground layer includes a first void, a second void, a third void, and a common mode filter. The first void and the second void are respectively arranged at opposite sides of a projection of the pair of differential transmission lines on the ground layer, and are bridged with the third void. The common mode filter includes a first filter portion positioned in the first void, and a second filter portion positioned in the second void. Each of the first and second filter portions includes a number of coils arranged side by side along a direction parallel to the projection of the pair of differential transmission lines.

5 Claims, 3 Drawing Sheets

PRINTED CIRCUIT BOARD

BACKGROUND

1. Technical Field

The present disclosure relates to printed circuit boards (PCBs), and particularly to a PCB with a common mode filter.

2. Description of Related Art

Nowadays, many PCBs include differential signal lines arranged in signal layers of the PCBs. To avoid common mode signals being transmitted through the differential signal lines, some common mode filters are connected to the differential signal lines to filter the common mode signals. However, these common mode filters will occupy some space of the PCBs and thus increase the costs.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements is illustrated by way of example and not by way of limitation. It should be noted that references to "an" or "one" embodiment in this disclosure are not necessarily to the same embodiment, and such references mean at least one.

Figure 1:
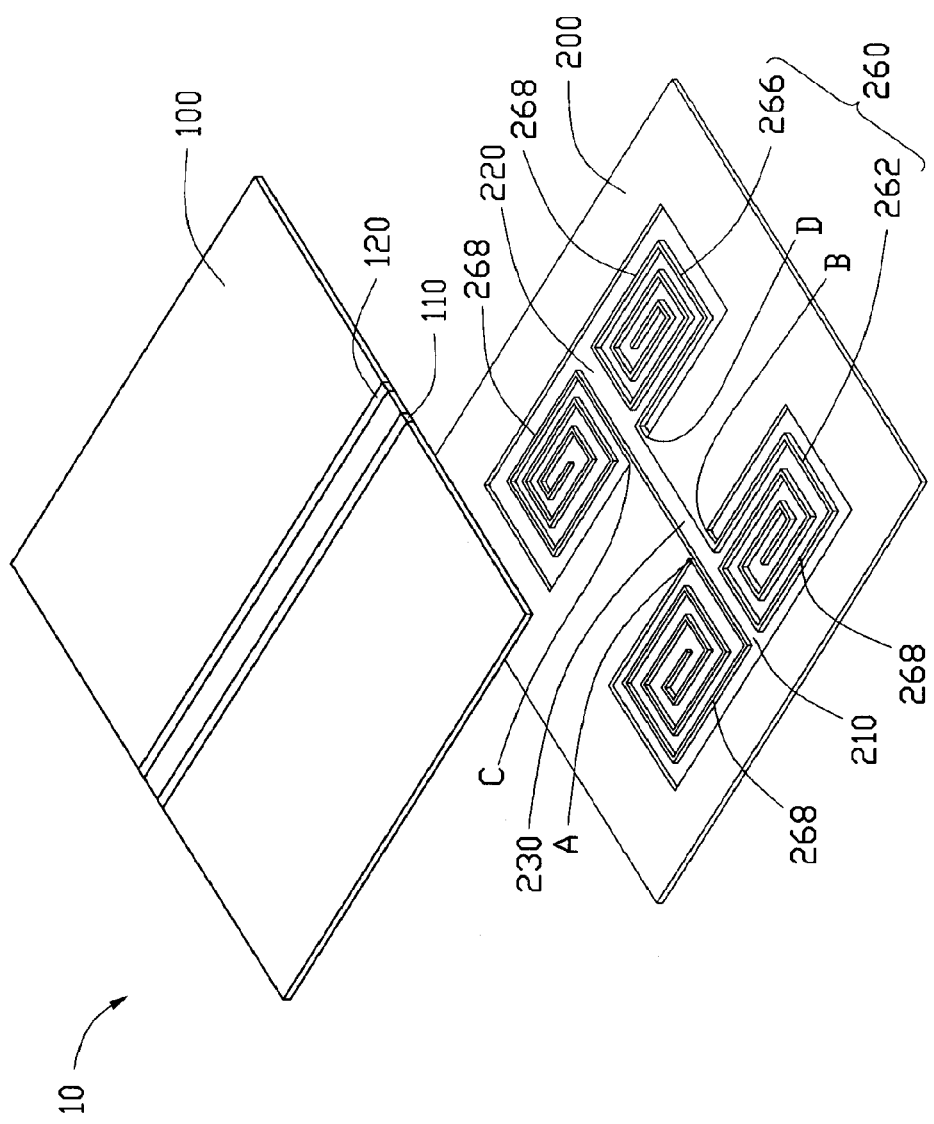
FIG. 1 is an exploded, isometric view of a printed circuit board (PCB), in accordance with an embodiment, the printed circuit board includes a common mode filter.
Figure 2:
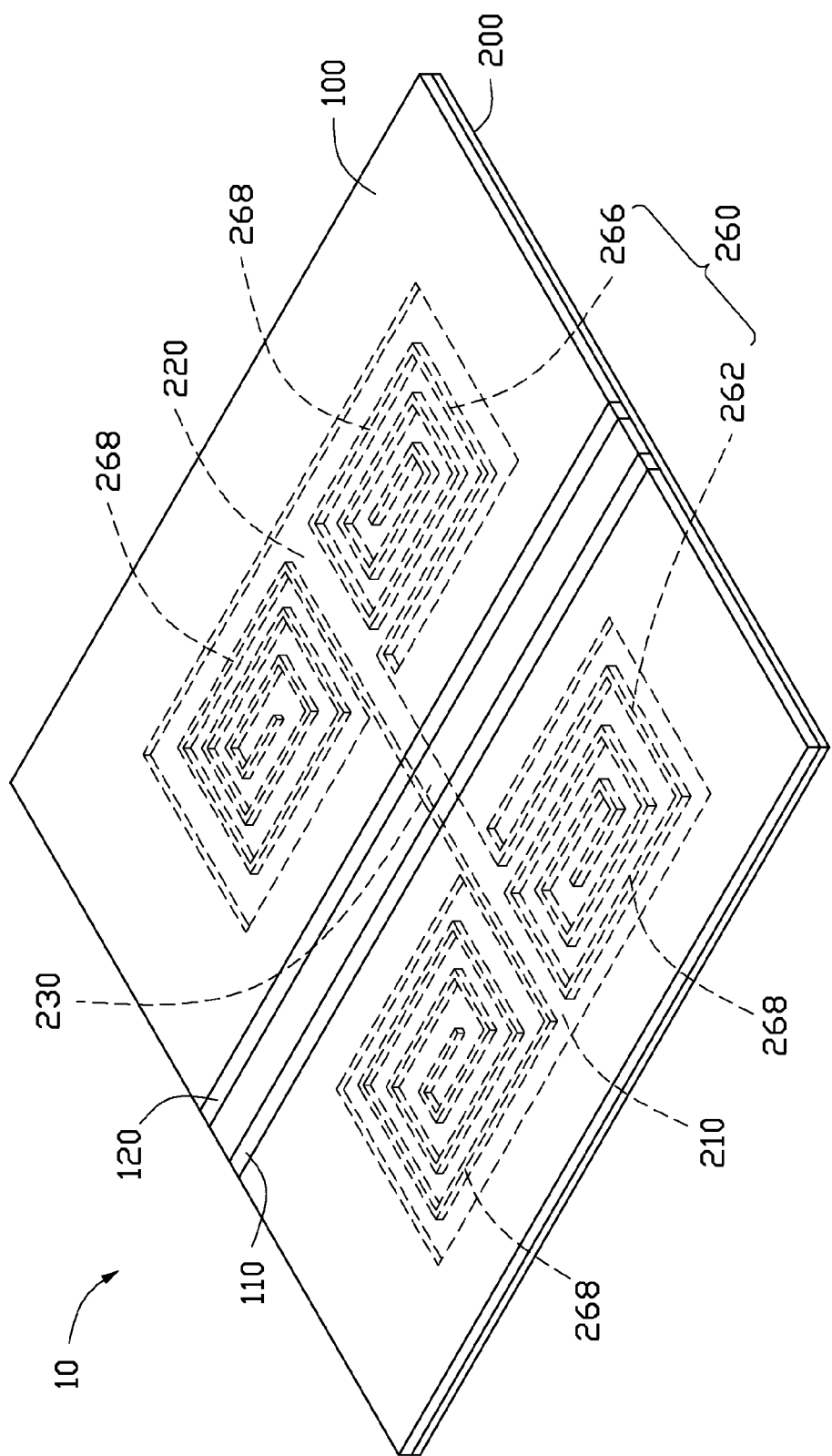
FIG. 2 is an assembled, isometric view of the PCB of FIG. 1.

Referring to FIGS. 1 and 2, an embodiment of a printed circuit board (PCB) 10 includes a signal layer 100 and a ground layer 200 adjacent to and below the signal layer 100. The signal layer 100 includes a pair of differential transmission lines 110 and 120. It may be understood that the PCB 10 also includes other layers, such as a power layer. These other layers fall within well-known technologies, and are therefore not described here.

To avoid some common mode signals being transmitted through the pair of differential transmission lines 110 and 120, the ground layer 120 is hollowed in some special positions to form a first void 210, a second void 220, a third void 230, and a common mode filter 260. The first void 210 and the second void 220 are respectively arranged at opposite sides of a projection of the pair of differential transmission lines 110 and 120 on the ground layer 200; and the first void 210 and the second void 220 are bridged with the third void 230. The common mode filter 260 includes a first filter portion 262 positioned in the first void 210, and a second filter portion 266 positioned in the second void 220. Each of the first filter portion 262 and the second filter portion 266 includes a plurality of coils 268 arranged side by side along a direction parallel to the projection of the pair of differential transmission lines 110 and 120. Each coil 268 includes a plurality of turns spirally extending in the same plane to form a spiral path. In one embodiment, each of the first filter portion 262 and the second filter portion 266 includes two coils 268 arranged side by side along the direction parallel to the projection of the pair of differential transmission lines 110 and 120. The third void 230 communicates with the first void 210 and the second void 220. The two coils 268 of the first filter portion 262 are arranged at opposite sides of the third void 230 and non-symmetrical along the third void 230, the two coils 268 of the second filter portion 266 are arranged at opposite sides of the third void 230 and non-symmetrical along the third void 230. One end of the third void 230 is defined between two points A and B where the two coils 268 in the first void 210 are connected to the ground layer 200. The other end of the third void 230 is defined between two points C and D where the two coils 268 in the second void 220 are connected to the ground layer 200. In other embodiments, the number of the coils 268 of each of the first filter portion 262 and the second filter portion 266 can be adjusted according to actual need.

In one embodiment, the shape of each of the first void 210 and second void 220 is substantially rectangular, and the long sides of each shape are parallel with the projection of the pair of differential transmission lines 110 and 120. The third void 230 is elongated and vertical to the projection of the pair of differential transmission lines 110 and 120. The turns of each coil 268 rectangularly spiral in the ground layer 200. The ground layer 200 is made of conductive material, such as copper. The first void 210, the second void 220, the third void 230, and the coils 268 are formed by etching the conductive material of the ground layer 200.

For common mode signals transmitted over the pair of differential transmission lines 110 and 120, because the frame of the first filter portion 262 and the second filter portion 266 can result in resonance of inductors and capacitors, the common mode signals will not easily pass through the pair of differential transmission lines 110 and 120. Therefore, the common mode filter 260 can effectively prevent common mode signals from passing through the pair of differential transmission lines 110 and 120.

Figure 3:
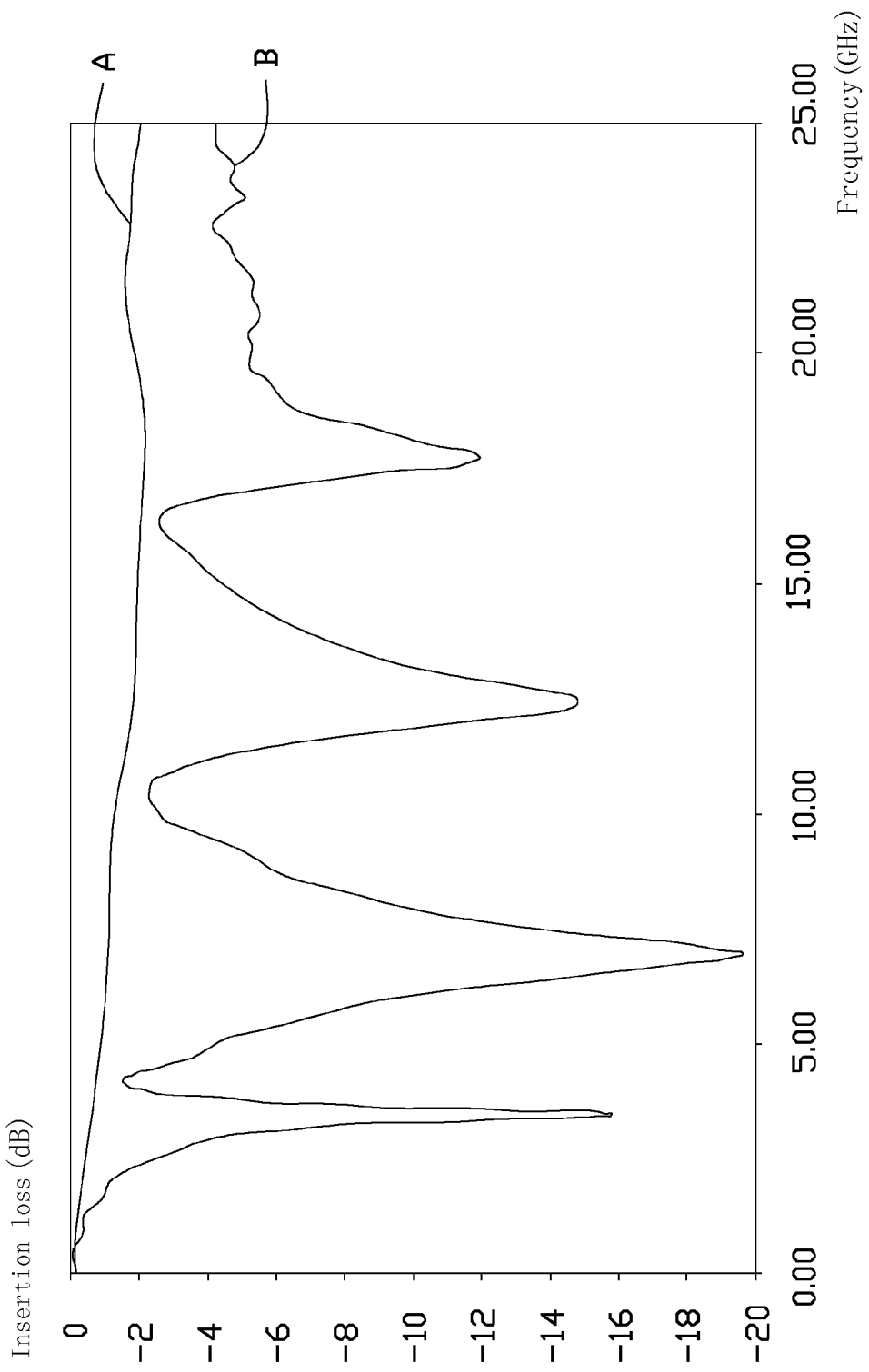
FIG. 3 is a simulation graph of insertion loss of the common mode filter of the PCB of FIG. 1.

Referring to FIG. 3, the curve A indicates insertion loss when differential signals are transmitted though the common mode filter 260, and the curve B indicates insertion loss when common mode signals are transmitted though the common mode filter 260. Obviously, the differential signals are almost entirely transmitted though the common mode filter 260, but the common mode signals are effectively filtered, especially at a special frequency range, such as 6.8-7.2 gigahertz (GHz). In other embodiments, the frequency range can be adjusted by changing some parameters, such as, the number of the coils 268 of each of the first filter portion 262 and the second filter portion 266, and the number of turns, the line width and line spacing of spiral path of each coil 268.

The PCB 10 doesn't use any common mode filters arranged on the PCB 10, therefore, the PCB 10 can save some space and cost.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board comprising:
a signal layer comprising a pair of differential transmission lines; and
a ground layer adjacent to the signal layer, comprising a first void, a second void, a third void, and a common mode filter, wherein the first void and the second void are respectively arranged at opposite sides of a projection of the pair of differential transmission lines on the ground layer, and are bridged via the third void, and wherein the common mode filter comprises:
a first filter portion positioned in the first void; and
a second filter portion positioned in the second void;
wherein each of the first and second filter portions comprises a first and a second coils arranged side by side along a direction parallel to the projection of the pair of differential transmission lines; and
wherein the third void communicates with the first and second voids, each the first and second coils of the first and second filter portions are arranged at opposite sides of the third void and non-symmetrical along the third void, one end of the third void is defined between two points where the first and second coils in the first void are connected to the ground layer, the other end of the third void is defined between two points where the first and second coils in the second void are connected to the ground layer.

2. The printed circuit board of claim 1, wherein a shape of each of the first void and the second void is substantially rectangular, and long sides of each shape are parallel with the projection of the pair of differential transmission lines.

3. The printed circuit board of claim 1, wherein the third void is elongated and vertical to the projection of the pair of differential transmission lines.

4. The printed circuit board of claim 1, wherein turns of each of the first and second coils rectangularly spiral in the ground layer.

5. The printed circuit board of claim 1, wherein the ground layer is made of conductive material, the first void, the second void, the third void, and the first and second coils are formed by etching the conductive material of the ground layer.

* * * * *